(12) United States Patent
Chang et al.

(10) Patent No.: US 8,153,350 B2
(45) Date of Patent: Apr. 10, 2012

(54) METHOD AND MATERIAL FOR FORMING HIGH ETCH RESISTANT DOUBLE EXPOSURE PATTERNS

(75) Inventors: Ching-Yu Chang, Yilang (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 852 days.

(21) Appl. No.: 12/205,509

(22) Filed: Sep. 5, 2008

(65) Prior Publication Data
US 2009/0011374 A1    Jan. 8, 2009

Related U.S. Application Data

(63) Continuation-in-part of application No. 11/209,684, filed on Aug. 24, 2005, now Pat. No. 7,531,296.

(51) Int. Cl.
*G03F 7/26* (2006.01)
(52) U.S. Cl. .................................................. 430/315
(58) Field of Classification Search .................. 430/311, 430/315
See application file for complete search history.

(56) References Cited

U.S. PATENT DOCUMENTS

| | | | |
|---|---|---|---|
| 5,667,940 A * | 9/1997 | Hsue et al. | 430/312 |
| 2003/0088995 A1 | 5/2003 | Bergman et al. | |
| 2004/0033445 A1 | 2/2004 | Lee et al. | |
| 2005/0233259 A1 | 10/2005 | Endo et al. | |

* cited by examiner

*Primary Examiner* — Kathleen Duda
(74) *Attorney, Agent, or Firm* — Birch, Stewart, Kolasch & Birch, LLP

(57) ABSTRACT

The present invention includes a lithography method comprising forming a first patterned resist layer including at least one opening therein over a substrate. A protective layer is formed on the first patterned resist layer and the substrate whereby a reaction occurs at the interface between the first patterned resist layer and the protective layer to form a reaction layer over the first patterned resist layer. The non-reacted protective layer is then removed. Thereafter, a second patterned resist layer is formed over the substrate, wherein at least one portion of the second patterned resist layer is disposed within the at least one opening of the first patterned resist layer. The substrate is thereafter etched using the first and second patterned resist layers as a mask.

30 Claims, 4 Drawing Sheets

METHOD AND MATERIAL FOR FORMING HIGH ETCH RESISTANT DOUBLE EXPOSURE PATTERNS

CROSS-REFERENCE

This is a continuation-in-part of application Ser. No. 11/209,684, filed on Aug. 24, 2005 now U.S. Pat. No. 7,531,296, entitled "METHOD OF FORMING A HIGH ETCH RESISTANT STRUCTURE".

BACKGROUND

Semiconductor technologies are continually progressing to smaller feature sizes, down to 65 nanometers, 45 nanometers, and below. A patterned photoresist layer used to produce such small feature sizes typically has a high aspect ratio. Maintaining a desired critical dimension (CD) can be very difficult for various reasons. For example, to keep a high etch resistance, a thick resist layer is usually utilized. However, a photoresist layer with a high thickness may suffer from pattern collapse and CD degradation during a photolithography patterning process. When double patterning techniques are utilized, additional issues may be brought out, such as round corners, resist pattern collapse, etching resistance, poor topography, exposure focusing errors, high manufacturing costs, and low throughput.

SUMMARY

The present invention includes a lithography method comprising forming a first patterned resist layer including at least one opening therein over a substrate. A protective layer is formed on the first patterned resist layer and the substrate whereby a reaction occurs at the interface between the first patterned resist layer and the protective layer to form a reaction layer over the first patterned resist layer. The non-reacted protective layer is then removed. Thereafter, a second patterned resist layer is formed over the substrate, wherein at least one portion of the second patterned resist layer is disposed within the at least one opening of the first patterned resist layer. The substrate is thereafter etched using the first and second patterned resist layers as a mask.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

It is understood that the following disclosure provides different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some instances, well-known structures and processes have not been described in detail to avoid unnecessarily obscuring the present invention.

FIGS. 1-8 are sectional views showing one embodiment of a device 2 during various stages of fabrication. With reference to FIGS. 1-8, a method for lithography patterning is described.

Figure 1:
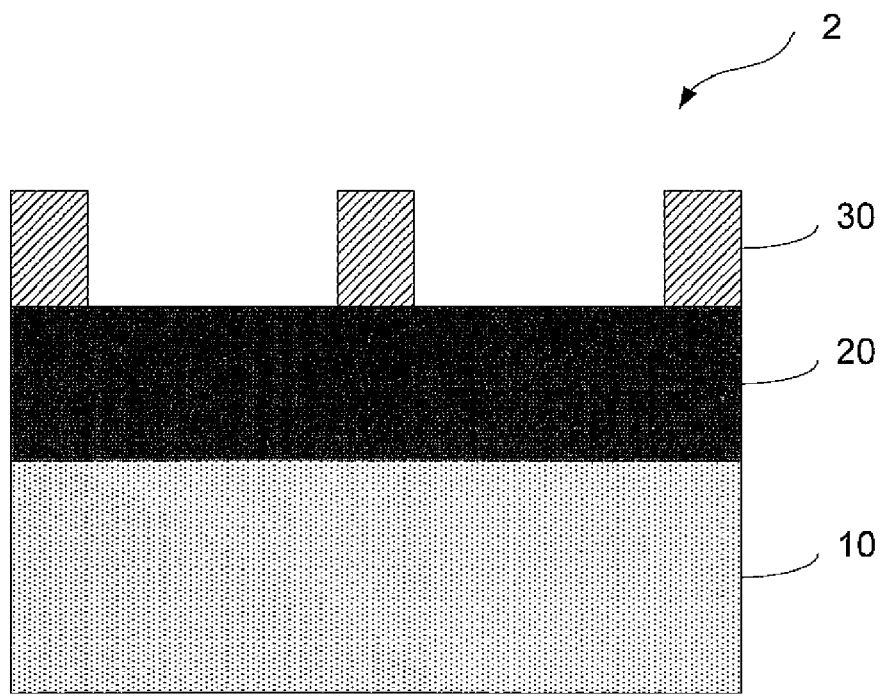
FIGS. 1-8 are sectional views of one embodiment of a device during various fabrication stages thereof.

FIG. 1 shows a semiconductor device 2 having a silicon substrate 10. The substrate 10 may alternatively be made of some other suitable semiconductor material, including Ge, SiGe, or GaAs. Further, the substrate 10 may alternatively be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 10 may include various doped regions, dielectric features, and multilevel interconnects. The substrate 10 may alternatively be a non-semiconductor material such as a glass substrate for thin-film-transistor liquid crystal display (TFT-LCD) devices, or fused quartz or calcium fluoride for a photomask (mask or reticle). The substrate 10 may include a layer to be patterned such as a dielectric layer, a semiconductor layer, or a poly-silicon layer.

A material layer 20 is formed on substrate 10. Material layer 20 may function as a hard mask, HMDS, and/or a bottom anti-reflective coating (BARC). Material layer 20 has a thickness ranging from about 5 angstroms to about 9000 angstroms in one embodiment. For example, the thickness of material layer 20 can be about 500 angstroms. In another embodiment, material layer 20 has a thickness ranging from about 500 angstroms to about 3500 angstroms. Further, material layer 20 may have other parameters that fall within selected ranges. For example, material layer 20 has a refractive index in a range between about 1 and 3, and an extinction coefficient (absorption value) κ in a range from about 0.01 to about 1.0. In one embodiment, the extinction coefficient κ has a range of from about 0.1 to about 0.5. Alternatively, material layer 20 may have a refractive index of about 1.75 and an extinction coefficient of about 0.2.

In the present embodiment, material layer 20 includes an organic polymer. Material layer 20 may be substantially free of silicon. Material layer 20 may include a photoresist (or resist) that is either positive-type or negative-type, with or without photosensitive material. Material layer 20 may include a proper BARC material and may further have a top layer to cover the BARC material. The top layer may be about 50 angstroms thick, and substantially free of hydroxyl groups and carboxyl groups. Material layer 20 may include conventional polymer material or resist material. For example, material layer 20 may be one of t-Butyloxycarbonyl (t-BOC) resist, acetal resist, and environmentally stabilized chemically amplified photoresist (ESCAP) that are known in the art. For the material layer 20 made of polymeric material, the polymeric material may be cross-linked. For example, the polymeric material can be spin-on coated or deposited by chemical vapor deposition (CVD) to the substrate 10 and then cross-linked using a baking process with temperature ranging from between about 90° C. to about 300° C. Alternatively, this temperature range could be about 100° C. to about 180° C. The polymeric material may also be of the non-cross-linked type, and in that case material layer 20 may use a solvent that is not capable of dissolving a resist layer or not dissolved by the resist layer formed above the material layer 20. For example, material layer 20 may use butanol as a solvent.

Alternatively, material layer 20 may use other suitable materials that are different from a protective layer that is to be formed above material layer 20 to protect a resist pattern on material layer 20. For example, material layer 20 may include silicon nitride or silicon oxynitride in order to be different from a protective layer containing silicon oxide, in which the two layers have substantially different etching rates during an etching process.

A first patterned resist layer 30 is then formed on material layer 20. First patterned resist layer 30 includes a plurality of openings, such that portions of material layer 20 are uncovered within the openings. The openings of first patterned resist layer 30 are configured according to a predetermined pattern. The first patterned resist layer 30 may have a thickness ranging from between about 50 angstroms to about 5,000 angstroms. Alternatively, the first patterned resist layer 30 may have a thickness ranging between about 500 angstroms to about 2000 angstroms. First patterned resist layer 30 may be a positive-type resist or a negative-type resist. For advanced semiconductor patterning using an extreme ultraviolet (EUV) radiation beam, the first patterned resist layer 30 may use a chemically amplified (CA) resist. First patterned resist layer 30 is formed by a lithography process that may include processing steps of resist coating, soft baking, mask aligning, exposing, post-exposure bake (PEB), developing, and hard baking. For illustration, the exposing process may be carried out by exposing the semiconductor device 2 under a radiation beam through a mask having a predefined pattern (or a reversed pattern). The radiation beam may be ultraviolet (UV) or extreme ultraviolet (EUW), such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, immersion lithography, electron-beam writing, ion-beam writing, and molecular imprint techniques.

The material for first patterned resist layer 30 may be one which has a mechanism for generating an acid component inside the resist by exposure to heat or light. For example, first patterned resist layer 30 is a positive resist and may include methacrylate resin, acrylate resin, novolac resin and a naphthoquinonediazide photosensitive agent. Further, a chemically amplified resist which make use of an acid generating mechanism may also be used as first patterned resist layer 30. Other types of resist materials may also be used for first patterned resist layer 30 so far as they utilize reaction systems of generating an acid by an appropriate application of heat or light.

First patterned resist layer 30 may be further processed using a hardening process. The hardening process may include plasma treatment, ultraviolet (UV) curing, ion implant bombardment, e-beam treatment, or combinations thereof.

Figure 2:
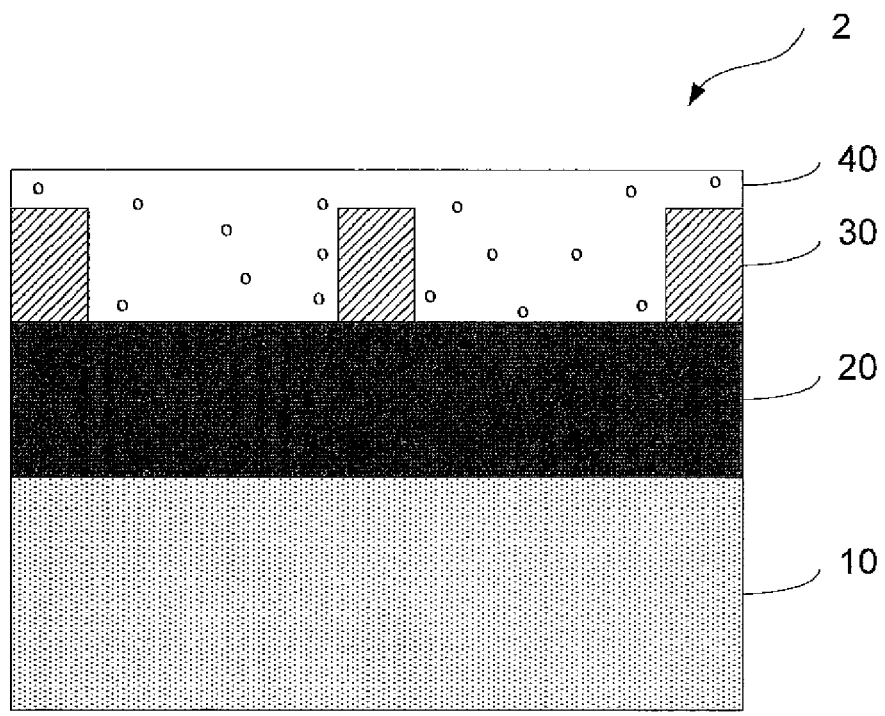

With reference now to FIG. 2, a protective layer 40 is formed on material layer 20 by planar or conformal coating. Protective layer 40 substantially fills the openings in first patterned resist layer 30. Protective layer 40 substantially covers portions of material layer 20 that are exposed within the openings in first patterned resist layer 30 and has a thickness that covers the first patterned resist layer 30. For example, protective layer 40 may have a thickness in the range of from about 100 angstroms to about 2000 angstroms. In one embodiment, protective layer 40 includes a silicon-rich material formed on material layer 20 by a proper technique such as spin-on coating, for example. In another embodiment, protective layer 40 includes an organic polymer. The organic polymer may contain, for example single-bond, double-bond, and triple-bond materials including benzyl or phenyl group polymers, silicon molecular or silicon polymer or combinations thereof. The organic polymer and silicon containing polymer have substantially higher etch resistances compared to normal polymers which have less than a double bond structure, tertiary carbon structure, or do not contain silicon. The polymeric material of the organic polymer may be cross-linked. The protective layer 40 may be thermally baked for cross-linking. Where the protective layer 40 includes a silicon-containing polymer, the polymer may include a silicon-containing material, carbide, a metal containing material, polymer, or combinations thereof. In other embodiments, the metal containing material contains metal such as titanium, titanium nitride, aluminum, tantalum, silicon, copper, Tungsten, tantalum nitride, and combinations thereof. In other embodiments, the silicon-containing material may include silicon oxide, silicon carbide, silicon nitride, silicon oxynitride, and combinations thereof. After coating of the protective layer 40, device 2 may be baked, for example, at from about 80 Celsius to about 230 Celsius for from about 10 seconds to about 120 seconds.

By way of a reactionary step such as, for example cross-linking, diffusion, chemical bonding, and ionic bonding that occurs at the interface between the first patterned resist layer 30 and protective layer 40, first patterned resist layer 30 can be made more etch resistant and/or more solvent resistant such that first patterned resist layer 30 is made insoluble in subsequent processing steps such as for example, coating of a second resist layer on first patterned resist layer 30 or during a developing step.

Figure 3:
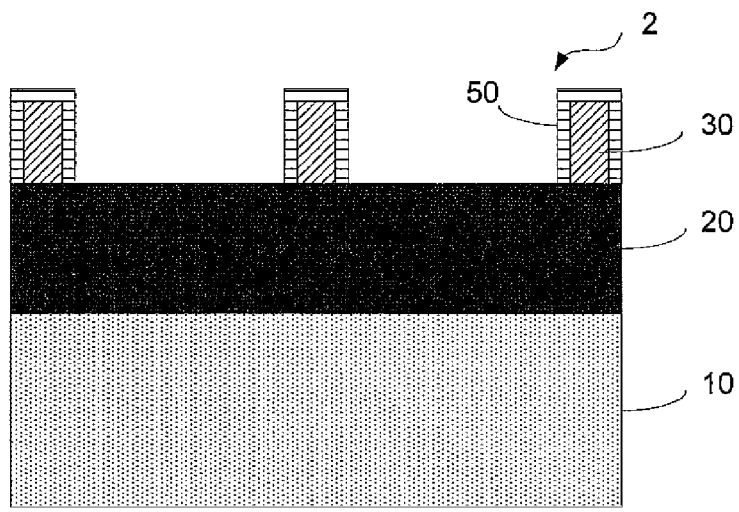

In a cross-linking reactionary process, upon exposure to heat or light, an acid diffuses from first patterned resist layer 30 into protective layer 40 and a cross-linking reaction occurs at the interface between the first patterned resist layer 30 and the protective layer 40. Alternatively, the acid may come from an optional acid treatment step or optical treatment step to produce the cross-linking reaction if the photoresist layer does not itself contain sufficient acid. FIG. 3 shows a reaction layer or cross-linked layer 50 formed over first patterned resist layer 30 following a development process to remove portions of the non cross-linked protective layer 40. The cross-linking reaction between first patterned resist layer 30 and protective layer 40 and the thickness of the cross-linked layer 50 formed over first patterned resist layer 30 may be controlled as desired. The cross-linking reaction should be optimized depending on the reactivity between first patterned resist layer 30 and protective layer 40, the shape and thickness of first patterned resist layer 30, and the intended thickness of the cross-linked layer 50. The effective process control of the cross-linking reaction may be done by the control of the mixing bake temperature and treating time. Especially, when the heating and cross-linking time is controlled, the thickness of the cross-linked layer can be controlled. This method ensures a very good reaction control. In one embodiment, device 2 is thermally treated to a temperature of from about 80 Celsius to about 250 Celsius for from about 15 seconds to about 300 seconds. In another embodiment, device 2 is thermally treated to a temperature of from about 110 Celsius to about 160 Celsius for from about 30 seconds to about 90 seconds. In one embodiment, the cross-linked layer 50 has a thickness ranging from about 10 angstroms to about 400 angstroms. The thermal treatment may be by way of ultraviolet, infrared, heat, hot plate, mega sonic, microwave, heating coil and future developed heating methods.

In place of or prior to the thermal treatment described above, cross-linked layer 50 may be formed over first patterned resist layer 30 by application of light. The light source used may include, for example Hg lamps, a KrF excimer, an ArF excimer and the like, depending on the sensitizing wavelength of first patterned resist layer 30. The light source is not critical so far as an acid is generated by exposure to light, and an appropriate light source or exposure may be selected depending on the sensitizing wavelength of first patterned resist layer 30.

In a diffusion process for creating a reaction layer 50 over first patterned resist layer 30, protective layer 40 may include Si, Ti, Ta as described above and single bond, double bond, and triple bond materials such as benzyl or phenyl group polymers, for example. The protective layer 40 may also include a cross linker such as, for example amine, diamine polymer or tri-amine polymer to form cross linking with the first patterned resist layer 30. The thermal treatment may be by way of ultra-violet, infrared, heat, hot plate, mega sonic, microwave, heating coil and future developed heating methods. The thermal treatment causes polymer molecules, atoms and/or silicon atoms to substantially diffuse from protective layer 40 into first patterned resist layer 30, thereby enhancing the latter's etch resistance as well as making first patterned resist layer 30 substantially insoluble to subsequent processing steps. In one embodiment, semiconductor device 2 is thermally treated at a temperature ranging from about 50° C. to about 250° C. for about 10 seconds to about 5 minutes. In another embodiment, device 2 is thermally treated at a temperature ranging from about 100° C. to about 150° C. for about 60 seconds to about two minutes. In another embodiment device 2 is thermally treated by conventional mega sonic power of from about 10 to 1000 Kw/Hz for about five seconds to about five minutes.

Reaction layer 50 may also be formed over first patterned resist layer 30 by way of a chemical bonding process. According to one aspect of the present disclosure, a functional group in the protective layer 40 reacts with the functional group in the first patterned resist layer 30 to form reaction layer 50. In one embodiment, the functional group of the protective layer 40 includes hydroxyl and amine and the functional group of the first patterned resist layer 30 includes lactone, carboxylic acid, and hydroxyl group. Following the chemical reaction, a thermal treatment may be performed. The thermal treatment process may be by way of a hard plate baking. In one embodiment semiconductor device 2 is baked at a temperature in the range of from about 80° C. to about 250° C. for a time of from about 15 seconds to about 2 minutes. In another embodiment, the semiconductor device 2 is balked at a temperature in the range of from about 110° C. to about 150° C. for a time of from about 60 seconds to about 90 seconds.

Following the reactionary step, FIG. 3 shows the removal of the non-reacted portions of the protective layer 40 leaving a reaction layer 50 formed over first patterned resist layer 30. The non-reacted portions of second layer 40 may be removed by conventional and future-developed solvents such as, for example, a liquid developer such as de-ionized water, TMAH (tetra methyl ammonium hydroxide), isobutanol solvent, isopentanol solvent, isopropyl alcohol (IPA), propylene glycol monomethyl ether (PGME), cyclopentanol, propylene glycol monomethyl ether acetate (PGMEA), and cyclo-hexanol. After the completion of the developing, an optional post-developing baking may be performed on device 2 to further enhance the etch and solvent resistancy of first patterned resist layer 30. In one embodiment, device 2 may be thermally treated at a temperature of from about 80° C. to about 150° C. for about 30 seconds to about 120 seconds. An optional second baking process may be performed on device 2 following the post developing baking to further enhance the cross-linking and solvent resistance of the first patterned resist layer 30. In one embodiment, device 2 may be thermally treated to a temperature of from about 100° C. to about 250° C. for about 30 seconds to about 120 seconds.

Figure 4:
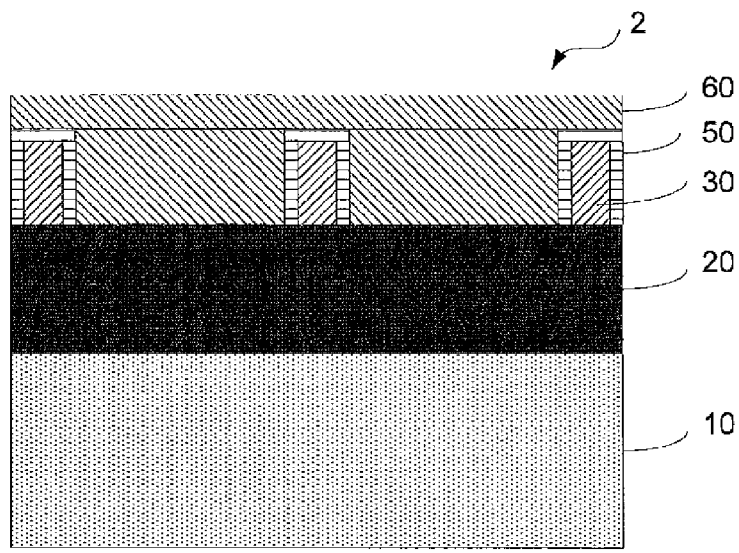
Figure 5:
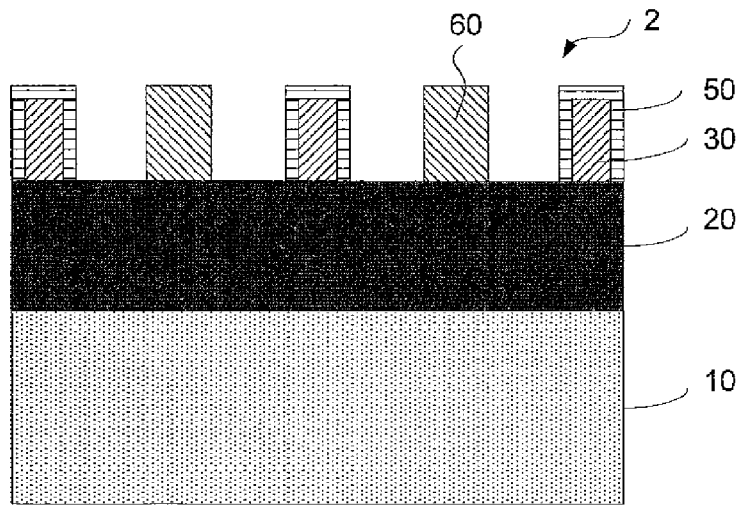

The formation of a second patterned resist layer 60 on material layer 20 by a second lithography process is shown in FIGS. 4 and 5. As shown in FIG. 4, a second resist layer is formed above material layer 20 and first patterned resist layer 30 and followed possibly by heating the resist layer to, for example, evaporate solvent. The desired pattern is then transferred to the resist layer by exposing the resist layer using, for example, an immersion lithography tool. After an optional post-exposure bake is performed, the exposed resist layer is developed using a developer rinse. A subsequent water rinse then removes the unwanted portions of the resist layer, leaving the first and second patterned resist layers 30 and 60, respectively, on material layer 20 as shown in FIG. 5.

Aspects of the disclosure allow the critical dimension (CD) of the first patterned resist layer 30 shown in FIG. 5 to remain substantially unchanged to the CD of the first patterned resist layer 30 shown in FIG. 1. Second patterned resist layer 60 may be substantially similar to first patterned resist layer 30 in terms of function, formation, and composition. The second patterned resist layer 60, like the first patterned resist layer 30, includes a plurality of second resist features and a plurality of openings defined by the second resist features, such that portions of material layer 20 not covered by the first and second resist patterns are exposed. The second resist features are configured according to another predetermined IC structure defined on a mask. In one embodiment, the second resist features are positioned such that one of the second resist features is interposed between two adjacent features of the first resist pattern. Similarly, two adjacent features of the second resist pattern is interposed by one of the first resist features.

The second patterned resist layer 60 is configured relative to first patterned resist layer 30 so as to utilize a double patterning structure. The openings in the first and second patterned resist layers 30 and 60, respectively, may be configured to achieve pitch splitting. After the formation of both the first and second resist patterns, a pitch, defined from the one feature of the first resist pattern to an adjacent feature of the second resist pattern, is halved, resulting in a reduced minimum features size. In one embodiment, a pitch from a feature of the first patterned resist layer to adjacent one of the second patterned resist layer is less than about 200 nm. In another embodiment, a pitch from a feature of the first patterned resist layer to adjacent one of the second patterned resist layer is less than about 100 nm. The openings defined by the first patterned resist layer 30 and the second patterned resist layer 60 may be configured to form various contact holes or trenches for metal interconnects.

Figure 6:
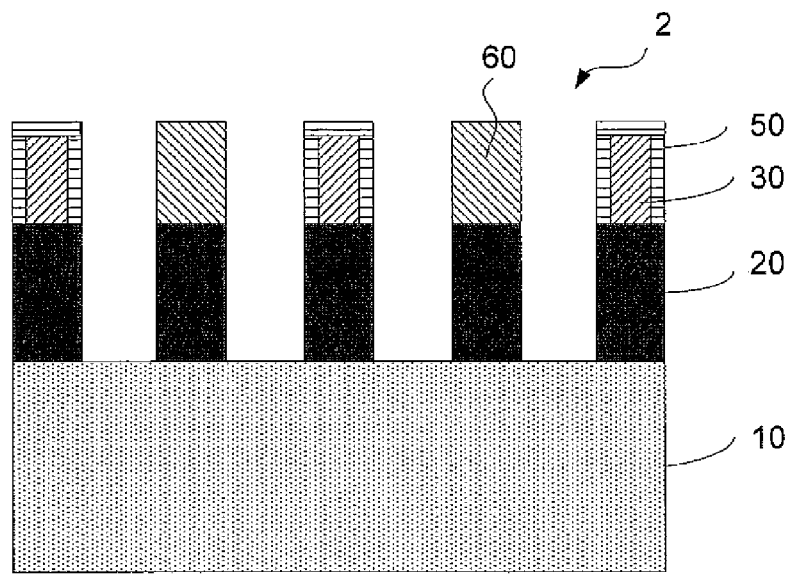

Referring now to FIG. 6, using the first and second patterned resist layers 30 and 60, respectively, as a mask, an etching process is applied to remove material layer 20 within the openings of first and second patterned resist layers 30 and 60, respectively. A suitable etching process, such as, for example a wet chemical etch or a dry plasma stripping may be used. In one embodiment, the etch process may use a $CF_4$, $C_3F_8$, $C_4F_8$, $CHF_3$, $CH_2F_2$ dry etch or a buffered hydrofluoric acid (BHF), ammonia peroxide mixture (APM), hydrochloride peroxide mixture, ammonia water, hydrochloride water, acid solution, base solution wet etch. In another embodiment, the etch process may use nitrogen plasma or a mixture of oxygen, hydrogen, carbon fluoride, carbon bromide and nitrogen plasma. Using first and second patterned resist layers 30 and 60, respectively, as a mask, an optional ion implantation step may also be performed on semiconductor device 2 to tune its electrical properties. In one embodiment, the dopants used may include boron, phosphate, or arsenic.

Figure 7:
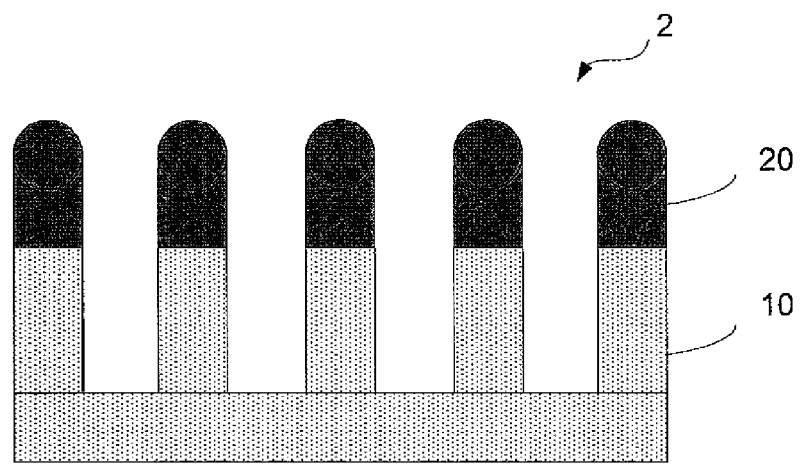
Figure 8:
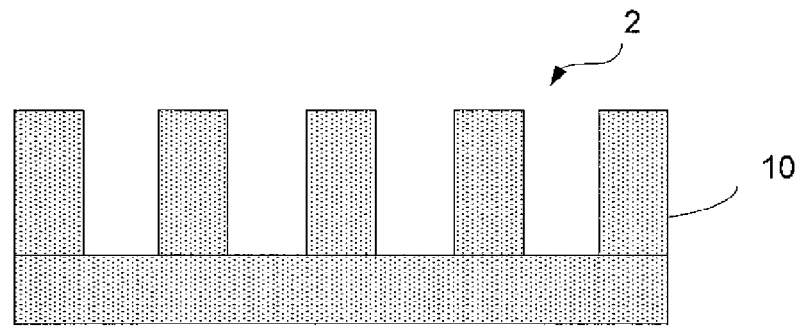

Referring to FIG. 7, the substrate 10 is further etched through using a suitable etching process such as, for example a dry etch or a wet etch. The first and second patterned resist layers 30 and 60, respectively, will be consumed and at least some of material layer 20 may be consumed during the etching process. The remainder of material layer 20 is thereafter removed, as illustrated in FIG. 8.

Figure 9:
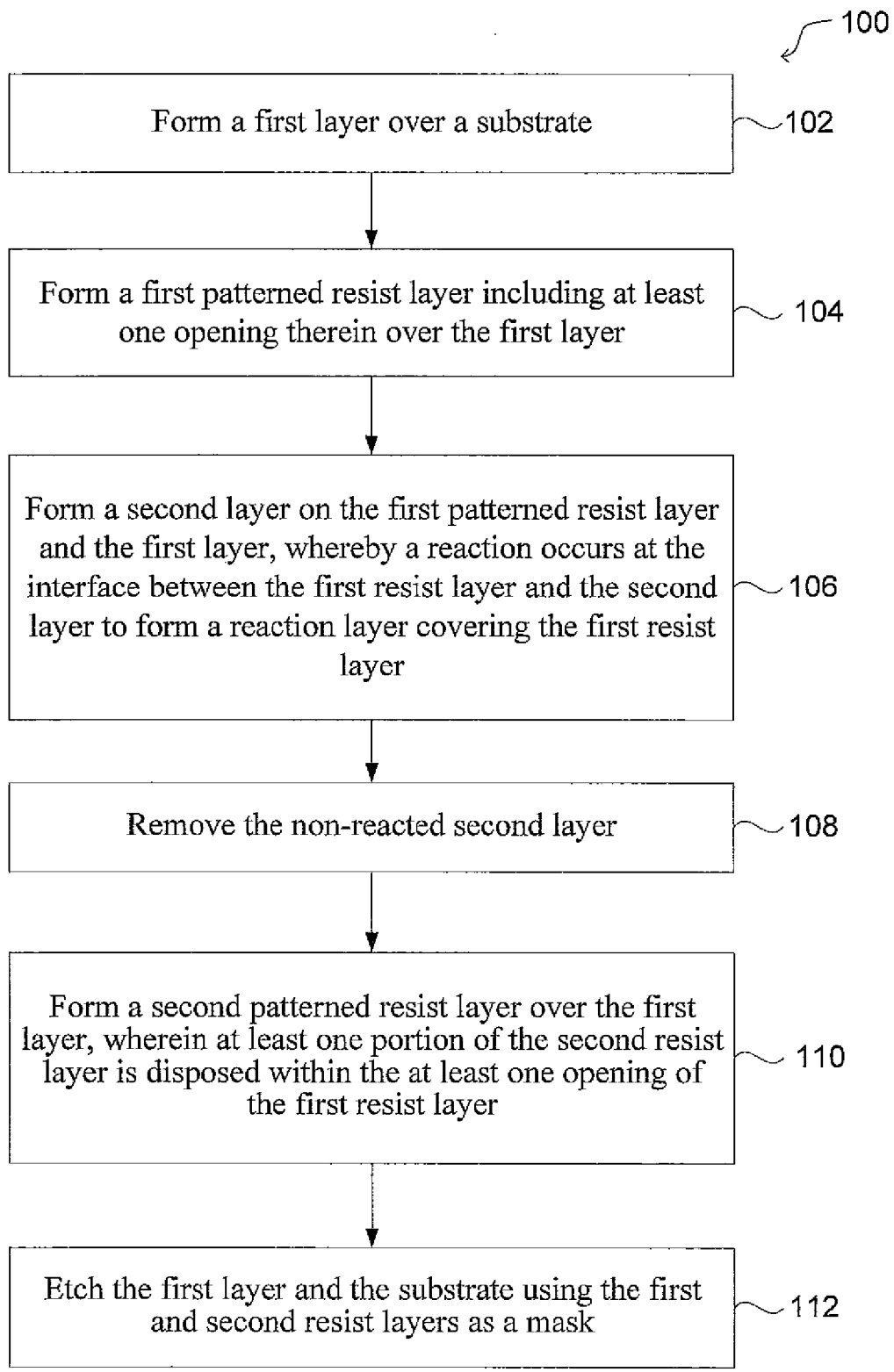
FIG. 9 is a flowchart showing one embodiment of a method of lithography patterning.

FIG. 9 is a flowchart showing an embodiment of a method 100 of lithography patterning, which is the lithography patterning described above in association with FIGS. 1-8. The method 100 begins at step 102 by forming a material layer over a substrate. At step 104, a first patterned resist layer including at least one opening therein is formed over the material layer. At step 106, a protective layer is formed on the first patterned resist layer and the material layer, whereby a reaction occurs at the interface between the first patterned resist layer and the protective layer to form a reaction layer covering the first patterned resist layer. At step 108, the non-reacted protective layer is removed. At step 110, a second patterned resist layer is formed over the material layer, wherein at least one portion of the second patterned resist layer is disposed within the at least one opening of the first patterned resist layer. At step 112, the first layer and the substrate are etched using the first and second patterned resist layers as a mask. Various changes, substitutions and alterations can be made in this method without departing from the spirit and scope of the present disclosure.

The method described above with reference to FIGS. 1 to 8 provides a double patterning process. Since only one etching process is used to etch the under resist layer(s), the manufacturing cost is lowered, throughput is improved, CD variation is minimized, and product quality is enhanced compared with existing double patterning and double etching methods. Moreover, since the reaction layer 50 is used as a hard mask during the etching process to remove the under resist layer(s), the first and second resist patterns are relieved from the function of etching resistance during the etching process to remove the underlying material layer; therefore, the thicknesses and CD bias of both the first and second resist layers can be reduced. CD control of the pattern formed on the under resist layer(s) is improved accordingly. Furthermore, as the etching resistance of the resist material is not relevant, the selection criteria of the resist material is also relaxed.

Various embodiments of a lithography patterning process have been introduced and described. Other modifications, variations, additions, and extensions may be used without departing from the scope of the disclosure. For example, a hardening process may be applied to a resist layer using a plasma treatment, UV curing, ion implantation, or e-beam treatment. In another example, a resist layer, a silicon-containing layer, or a metal-containing layer may use a different solvent to avoid mixing or interdiffusion. All of the above techniques that include hardening and utilizing different solvents may be alternatively implemented, or combined, depending on the configuration and the processing procedure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method comprising:
   forming a first patterned resist layer including at least one opening therein over a substrate;
   forming a first layer on the first patterned resist layer and the substrate, whereby a reaction occurs at the interface between the first patterned resist layer and the first layer to form a reaction layer over the first patterned resist layer;
   removing the non-reacted first layer; and
   forming a second patterned resist layer over the substrate, wherein at least one portion of the second patterned resist layer is disposed within the at least one opening of the first patterned resist layer.

2. The method of claim 1, further comprising etching the substrate using the first and second patterned resist layers as a mask.

3. The method of claim 1, wherein the reaction layer protects the first patterned resist layer from a subsequent processing step.

4. The method of claim 3, wherein the subsequent processing step includes the forming of the second patterned resist layer.

5. The method of claim 1, further comprising forming a second layer over the substrate prior to the forming of the first patterned resist layer.

6. The method of claim 5, wherein the second layer comprises organic polymer.

7. The method of claim 5, wherein the second layer has a thickness in the range of from about 5 angstroms to about 9000 angstroms.

8. The method of claim 1, wherein the first layer has a thickness in the range of from about 100 angstrom to about 2000 angstroms.

9. The method of claim 1, wherein the first layer is capable of being cross-linked with an acid.

10. The method of claim 1, wherein the first layer comprises a silicon-rich material.

11. The method of claim 1, wherein the first layer comprises organic polymer.

12. The method of claim 11, wherein the organic polymer of the first layer comprises silicon-containing polymer.

13. The method of claim 1, wherein the first layer comprises a component selected from the group consisting of a silicon-containing material, carbide, a metal containing material, and combinations thereof.

14. The method of claim 13, wherein the metal containing material comprises one selected from the group consisting of Si, Ti, TiN, Ta, Al, Cu, W, TaN, and combinations thereof.

15. The method of claim 13, wherein the silicon-containing material of the inorganic material comprises one selected from the group consisting of silicon oxide, silicon carbide, silicon nitride, silicon oxynitride, and combinations thereof.

16. The method of claim 1, wherein the reaction occurring at the interface between the first patterned resist layer and the first layer is a chemical bonding reaction.

17. The method of claim 1, wherein the first patterned resist layer comprises a cross-linking agent.

18. The method of claim 1, wherein the reaction occurring at the interface between the first patterned resist layer and the first layer is a crosslink bonding reaction.

19. The method of claim 1, wherein a pitch from a feature of the first patterned resist layer to adjacent one of the second patterned resist layer is less than about 200 nm.

20. The method of claim 1, wherein a pitch from a feature of the first patterned resist layer to adjacent one of the second patterned resist layer is less than about 100 nm.

21. A lithography method comprising:
forming a first patterned resist layer including at least one opening therein over a substrate;
forming a first layer on the first patterned resist layer and the substrate;
treating the first layer and the first patterned resist layer to cause an acid to diffuse from the first patterned resist layer into the first layer and create insoluble portions in the first patterned resist layer at the interface between the first patterned resist layer and the first layer;
removing the soluble portions of the first layer; and
forming a second patterned resist layer over the substrate, wherein at least one portion of the second patterned resist layer is disposed within the at least one opening of the first patterned resist layer.

22. The method of claim 21, wherein the treating comprises heating the first layer and the first patterned resist layer.

23. The method of claim 21, wherein the treating comprises exposing the first layer and the first patterned resist layer to a light source.

24. The method of claim 21, wherein the first layer comprises a silicon-rich material.

25. The method of claim 21, wherein the first layer comprises silicon-containing polymer.

26. A lithography method comprising:
forming a first patterned resist layer including at least one opening therein over a substrate;
forming a first layer on the first patterned resist layer and the substrate;
treating the first layer and the first patterned resist layer to cause an acid to be generated from the first patterned resist layer and to cross-link with the first layer to create cross-linked portions in the first patterned resist layer at the interface between the first patterned resist layer and the first layer;
removing the non cross-linked portions of the first layer; and
forming a second patterned resist layer over the substrate, wherein at least one portion of the second patterned resist layer is disposed within the at least one opening of the first patterned resist layer.

27. The method of claim 26, wherein the treating comprises heating the first layer and the first patterned resist layer.

28. The method of claim 26, wherein the treating comprises exposing the first layer and the first patterned resist layer to a light source.

29. The method of claim 26, wherein the first layer comprises a silicon-rich material.

30. The method of claim 26, wherein the first layer comprises silicon-containing polymer.

* * * * *